United States Patent
Bergman et al.

(10) Patent No.: US 11,211,252 B2
(45) Date of Patent: Dec. 28, 2021

(54) SYSTEMS AND METHODS FOR COPPER (I) SUPPRESSION IN ELECTROCHEMICAL DEPOSITION

(71) Applicant: Applied Materials, Inc., Santa Clara, CA (US)

(72) Inventors: Eric J. Bergman, Kalispell, MT (US); John L. Klocke, Kalispell, MT (US); You Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/260,611

(22) Filed: Jan. 29, 2019

(65) Prior Publication Data
US 2019/0237335 A1    Aug. 1, 2019

Related U.S. Application Data

(60) Provisional application No. 62/623,165, filed on Jan. 29, 2018.

(51) Int. Cl.
*C25D 3/38* (2006.01)
*C25D 7/12* (2006.01)
(Continued)

(52) U.S. Cl.
CPC ............ *H01L 21/2885* (2013.01); *C25D 3/38* (2013.01); *C25D 5/10* (2013.01); *C25D 7/123* (2013.01);
(Continued)

(58) Field of Classification Search
None
See application file for complete search history.

(56) References Cited

U.S. PATENT DOCUMENTS 6,093,238 A * 7/2000 Hut .................. B01D 53/22
                                                96/8
6,454,927 B1 * 9/2002 Stevens ............ C25D 21/14
                                                204/274
(Continued)

FOREIGN PATENT DOCUMENTS

CN     106435664 A       2/2017
FR     2691282 A1 *     11/1993
WO     2015-002942 A1    1/2015

OTHER PUBLICATIONS

International Search Report dated Apr. 29, 2019 in International Patent Application No. PCT/US2019/015427, all pages.

(Continued)

*Primary Examiner* — Harry D Wilkins, III
(74) *Attorney, Agent, or Firm* — Kilpatrick Townsend & Stockton LLP

(57) ABSTRACT

Electroplating systems according to the present technology may include a two-bath electroplating chamber including a separator configured to provide fluid separation between a first bath configured to maintain a catholyte during operation and a second bath configured to maintain an anolyte during operation. The electroplating systems may include a catholyte tank and an anolyte tank fluidly coupled with the two baths of the two-bath electroplating chamber. The electroplating systems may include a first pump configured to provide catholyte from the catholyte tank to the first bath. The electroplating systems may include a second pump configured to provide anolyte from the anolyte tank to the second bath. The electroplating systems may also include an oxygen-delivery apparatus configured to provide an oxygen-containing fluid within the electroplating system.

15 Claims, 4 Drawing Sheets

(51) Int. Cl.
      *C25D 21/14*       (2006.01)
      *H01L 21/288*     (2006.01)
      *C25D 5/10*        (2006.01)
      *H01L 21/768*     (2006.01)

(52) U.S. Cl.
      CPC ........ *C25D 21/14* (2013.01); *H01L 21/76843* (2013.01)

(56) References Cited

U.S. PATENT DOCUMENTS

| | | |
|---|---|---|
| 2002/0166763 A1 | 11/2002 | Tsai et al. |
| 2007/0181441 A1 | 8/2007 | Kovarsky et al. |
| 2009/0038952 A1* | 2/2009 | Tachibana .............. C25D 21/16 205/296 |
| 2011/0226613 A1 | 9/2011 | Rash et al. |
| 2013/0284604 A1 | 10/2013 | Spurlin et al. |
| 2014/0097088 A1 | 4/2014 | Stowell et al. |

OTHER PUBLICATIONS

International Preliminary Report on Patentability dated Aug. 4, 2020 in International Patent Application No. PCT/US2019/015427, 9 pages.
Extended European Search Report dated Sep. 6, 2021 in European Patent Application No. 19743799.9, 8 pages.

* cited by examiner

SYSTEMS AND METHODS FOR COPPER (I) SUPPRESSION IN ELECTROCHEMICAL DEPOSITION

CROSS-REFERENCE TO RELATED APPLICATIONS

This application claims the benefit of U.S. Provisional Application No. 62/623,165, filed Jan. 29, 2018, which is hereby incorporated by reference in its entirety for all purposes.

TECHNICAL FIELD

The present technology relates to systems and methods for semiconductor processing. More specifically, the present technology relates to systems and methods for reducing a concentration of copper (I) in electroplating operations.

BACKGROUND

Integrated circuits are made possible by processes which produce intricately patterned material layers on substrate surfaces. During metallization, metal layers are often formed in vias and trenches across a substrate or semiconductor wafer. As devices continue to reduce in size, improving the characteristics of the layers produced may become more important.

Thus, there is a need for improved systems and methods that can be used to produce high quality devices and structures. These and other needs are addressed by the present technology.

SUMMARY

Electroplating systems according to the present technology may include a two-bath electroplating chamber including a separator configured to provide fluid separation between a first bath configured to maintain a catholyte during operation and a second bath configured to maintain an anolyte during operation. The electroplating systems may include a catholyte tank fluidly coupled with the first bath of the two-bath electroplating chamber. The electroplating systems may include an anolyte tank fluidly coupled with the second bath of the two-bath electroplating chamber. The electroplating systems may include a first pump fluidly coupled between the catholyte tank and the first bath. The first pump may be configured to provide catholyte from the catholyte tank to the first bath. The electroplating systems may include a second pump fluidly coupled between the anolyte tank and the second bath. The second pump may be configured to provide anolyte from the anolyte tank to the second bath. The electroplating systems may also include an oxygen-delivery apparatus configured to provide an oxygen-containing fluid within the electroplating system.

In some embodiments, the oxygen-delivery apparatus may be fluidly coupled with the anolyte tank. The oxygen-delivery apparatus may be fluidly coupled with the second bath of the two-bath electroplating chamber. The oxygen-delivery apparatus may be fluidly coupled with the catholyte tank. The oxygen-delivery apparatus may be fluidly coupled with the catholyte tank proximate an intake to the first pump. The electroplating system may also include a bubble separator fluidly coupled between the first pump and the first bath of the two-bath electroplating chamber. The oxygen-delivery apparatus may additionally be fluidly coupled with the anolyte tank. The oxygen-delivery apparatus may be fluidly coupled with the anolyte tank proximate an intake to the second pump. The system may also include a dissolved-oxygen sensor in communication with the oxygen-delivery apparatus. The dissolved-oxygen sensor may be configured to provide feedback by which the oxygen-delivery apparatus may be controlled to maintain a concentration of dissolved oxygen above about 10 ppm.

The electroplating system may incorporate the dissolved-oxygen sensor within the catholyte tank, the anolyte tank, or the two-bath electroplating chamber. The oxygen-delivery apparatus may include a compressor configured to draw ambient air into a filter configured to remove nitrogen from the ambient air. The oxygen-delivery apparatus may be an ozone generator. The system may also include an additional two-bath electroplating chamber including a separator configured to provide fluid separation between a third bath configured to maintain the catholyte during operation and a third bath configured to maintain the anolyte during operation. The oxygen-delivery apparatus may be fluidly coupled with the catholyte tank proximate an intake to the first pump. The first pump may additionally be fluidly coupled between the catholyte tank and the third bath, and the electroplating system may also include a bubble separator fluidly coupled between the first pump and the third bath of the additional two-bath electroplating chamber.

The present technology may also encompass additional electroplating systems. The systems may include an electroplating chamber configured to house an electrolyte. The systems may include an electrolyte tank fluidly coupled with the electroplating chamber. The systems may include a pump fluidly coupled between the electrolyte tank and the electroplating chamber, and the pump may be configured to provide electrolyte from the electrolyte tank to the electroplating chamber. The systems may also include an oxygen-delivery apparatus configured to provide an oxygen-containing fluid within the electroplating system. The systems may also include an additional electroplating chamber. The oxygen-delivery apparatus may be fluidly coupled with the electrolyte tank proximate an intake to the pump. The pump may additionally be fluidly coupled between the electrolyte tank and the additional electroplating chamber. The electroplating system may also include a bubble separator fluidly coupled between the pump and the additional electroplating chamber.

The present technology also encompasses methods of maintaining an oxygen concentration in an electroplating bath. The methods may include measuring a dissolved-oxygen concentration with a sensor within an electroplating system. The methods may include providing feedback from the sensor regarding the dissolved-oxygen concentration within an electrolyte of the electroplating system. The methods may also include modulating an oxygen-delivery apparatus configured to provide an oxygen-containing fluid to maintain a dissolved-oxygen concentration above about 10 ppm within the electrolyte.

In some embodiments the oxygen-delivery apparatus may be fluidly coupled proximate an intake to a pump configured to provide the electrolyte to the electroplating bath. The electroplating system may also include a bubble separator fluidly coupled between the pump and the electroplating bath. The electroplating system may include a two-bath electroplating chamber including a separator configured to provide fluid separation between a first bath configured to maintain a catholyte during operation and a second bath configured to maintain an anolyte during operation. The electrolyte may be at least one of the anolyte or the catholyte. The system may include a catholyte tank fluidly coupled with the first bath of the two-bath electroplating chamber. The system may include an anolyte tank fluidly coupled with the second bath of the two-bath electroplating chamber. The system may include a first pump fluidly coupled between the catholyte tank and the first bath, and the first pump may be configured to provide catholyte from the catholyte tank to the first bath. The system may include a second pump fluidly coupled between the anolyte tank and the second bath, and the second pump may be configured to provide anolyte from the anolyte tank to the second bath. In some embodiments, the system may include an electroplating chamber configured to define the electroplating bath in which the electrolyte is maintained during operation. The system may include an electrolyte tank fluidly coupled with the electroplating chamber. The system may also include a pump fluidly coupled between the electrolyte tank and the electroplating chamber, and the pump may be configured to provide electrolyte from the electrolyte tank to the electroplating chamber.

Such technology may provide numerous benefits over conventional technology. For example, the present systems provide a cost effective solution to reducing hillock formation during electroplating operations. Additionally, the present systems and methods may improve quality while having a limited effect on bath chemistries and process parameters. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Figure 1:
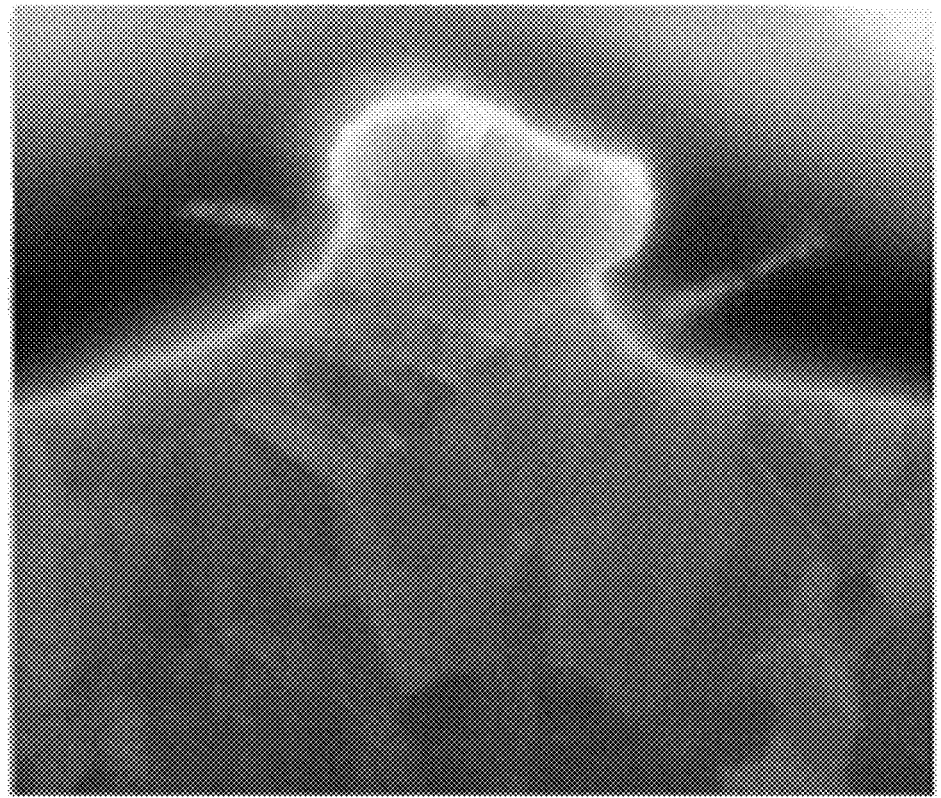
FIG. 1 shows an image of hillock formation during copper electrodeposition according to aspects of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

A variety of systems are used in the semiconductor industry for electrodeposition. For example, electroplating may be performed in single bath electrolyte systems having a single electrolyte in contact with both the anode and cathode. Plating may also be performed in two-bath electrolyte systems including an anolyte and catholyte. The two-bath chamber typically includes a separator or membrane separating the two fluids, while allowing certain ions to permeate the membrane and cause plating at the cathode.

The anode of the system may be inert or active. In copper electrodeposition processes, an active anode is at least partially if not fully formed of copper, which may replenish the system with copper ions as they are plated out at the cathode. Thus, as copper ions are reduced at the cathode to form metal, an oxidation reaction occurring at the anode may rebalance the system by providing additional copper ions. However, these formed ions may include multiple valences of copper including copper (I), commonly termed cuprous, as well as copper (II), commonly termed cupric. Copper (II) may generally be the predominantly formed species during the oxidation reaction, but an amount of copper (I) is often formed as well. Both species of copper may be reduced at the cathode to form copper metal across a substrate, although copper (I) may produce unwanted side effects during plating.

A number of additives are often included within an electrolytic bath and may be specific to a particular supplier. Once a given additive supplier is selected by a device producer, substantial testing is performed to qualify the additives within a bath to ensure proper formation on devices is achieved. This testing may include lifecycle testing that may require many months of testing. Accordingly, the qualification process can be very expensive and time consuming, and thus once qualified, many manufacturers are unlikely if not unwilling to modify bath chemistry.

Additives included in a bath can include several items that may be termed differently from different suppliers. Often, however, the additives may include one or more of accelerators, suppressors, levelers, and ionic species incorporated within the bath, such as within the catholyte to facilitate reduction to metal. Accelerators are materials that are often included to increase the rate at which copper ions transport to active surfaces where reduction to metal occurs, and often include sulfur-containing materials, such as, for example only, bis(sodiumsulfopropyl)disulfide. Suppressors and ionic species, such as chloride ions, are often included to slow plating in more exposed regions of the substrate. Levelers generally polarize high current density areas and facilitate current distribution. Many of these compounds include organic species or polymers that can degrade over time, and thus protection of additives may be important to reduce operating costs during electroplating. The additives are often incorporated in specific amounts and based on specific interactions with the ionic species to be reduced.

In the case of copper (II), these additives facilitate controlled formation along a variety of features and surfaces of a substrate. The additives may, however, interact differently with copper (I) ions within the electrolyte bath. For example, copper (I) ions often interact with additives and chloride ions to form groupings or clusters within the electrolyte bath, which may reduce on the surface of the substrate as hillocks or nodules, as opposed to in single atoms that may produce a more consistent surface. FIG. 1 shows an image of hillock formation during copper electrodeposition as may occur from copper (I) reduction. The hillocks may or may not affect overall device performance depending on the device on which the deposition is being performed, and removal has proven difficult within the industry.

Some conventional technologies have attempted to address hillock formation by reducing electrodeposition temperature or current, which may reduce copper (I) formation. However, these adjustments often increase process queue times and increase cost of manufacturing. Modifying bath chemistry may assist in reduction of copper (I) formation, however due to the cost and time associated with bath requalification, many manufacturers resist such changes. Although adjusting temperature, plating rate, or current load may aid the reduction in copper (I) formation, the effects may not be sufficient as hillocks are often still formed and several hundred may still be present across a substrate.

The present technology overcomes these issues by providing oxygen into the electrolyte system at a relatively high concentration. By incorporating an onboard oxygen-delivery apparatus to the electroplating system in one of several ways, dissolved-oxygen concentration can be increased within the electrolyte or electrolytes, which may affect copper (I) formation. Incorporating this solution may also be a low-cost process that may allow minimal adjustments to bath chemistries, and may allow normal operating temperatures and current loads to be used during plating.

Although the remaining portions of the specification will routinely reference semiconductor processing, the present techniques should not be considered limited to semiconductors. For example, many technologies seek to perform copper plating having uniform surface characteristics and profiles. The present process techniques may be suitable for these technologies as well, which may afford a more uniform surface profile of copper or other metallic species during electrochemical operations. The following figures will address a number of possible configurations incorporating an oxygen-delivery apparatus into an electroplating system according to embodiments of the present technology.

Figure 2:
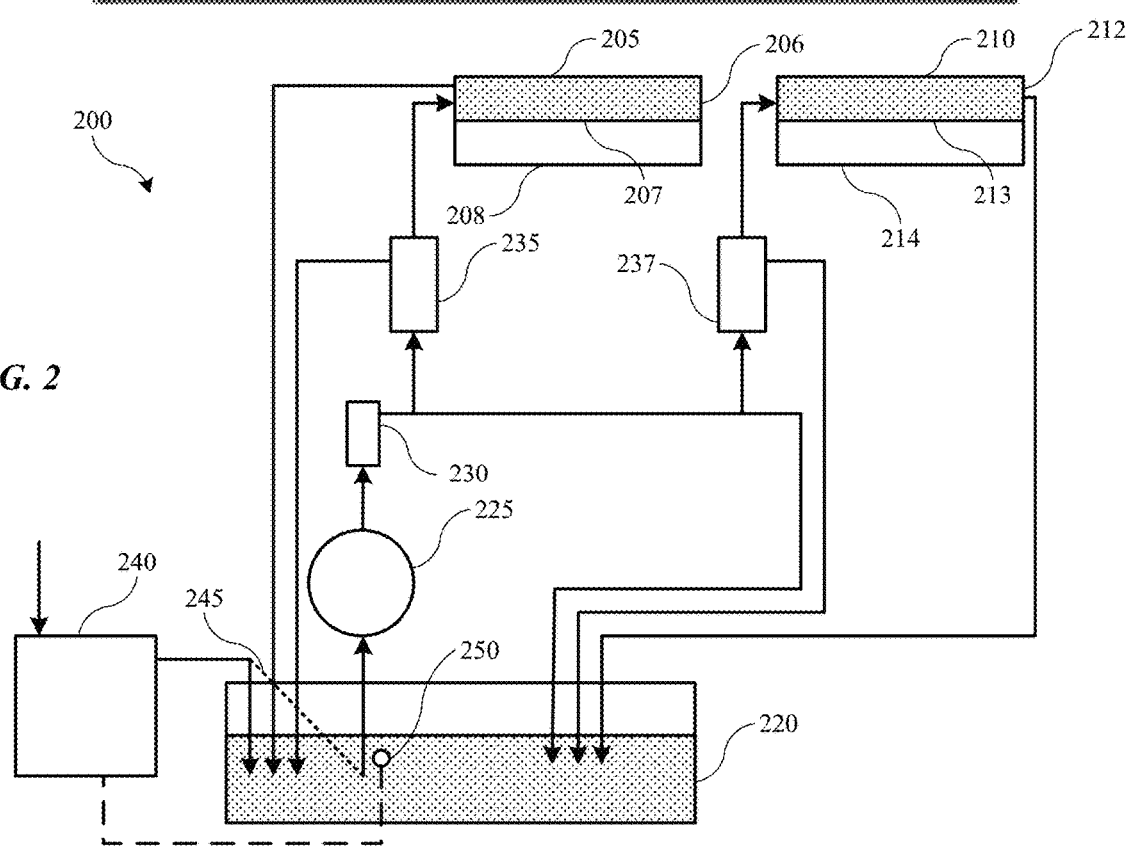
FIG. 2 shows a schematic view of an electroplating system according to some embodiments of the present technology.

FIG. 2 shows a schematic view of an electroplating system 200 according to some embodiments of the present technology. Electroplating system 200 illustrates a two-bath system, although single-bath systems may similarly benefit from the present technology as will be discussed further below. Electroplating system 200 is shown including a pair of two-bath electroplating chambers, including chamber 205 and chamber 210. It is to be understood, however, that systems according to the present technology may include one or more chambers utilizing an electrolyte bath, and may include any number of chambers. As shown, chamber 205 may include a first bath 206 configured to maintain a catholyte during operation, as well as a second bath 208 configured to maintain an anolyte during operation. A separator 207 may provide fluid separation between the anolyte and catholyte, while allowing ionic transport across the separator. Similarly, chamber 210 may include a third bath 212 configured to maintain a catholyte during operation, as well as a fourth bath 214 configured to maintain an anolyte during operation. A separator 213 may provide fluid separation between the two baths.

Electroplating system 200 may also include a catholyte tank 220. Catholyte tank 220 may be fluidly coupled with the electroplating chambers 205, 210, and may specifically be fluidly coupled with the first bath 206 of chamber 205 and with the third bath 212 of chamber 210. Although not shown in this embodiment, the system may include a similar anolyte tank coupled with the second bath of chamber 205 and with the fourth bath of chamber 210, as will be discussed with additional embodiments below.

Pump 225 may be included in the electroplating system 200 to provide fluid communication between the catholyte tank 220 and the first bath 206 of chamber 205 and with the third bath 212 of chamber 210. In other embodiments dedicated pumps may be provided for each two-bath electroplating system, although a single pump may be utilized as illustrated. The pump 225 may be configured to provide catholyte to the electroplating chamber to ensure a consistent chemistry is maintained during deposition processing. Pump 225 may be a first pump in some embodiments in which a second pump is included with an associated anolyte tank as will be discussed further below for providing anolyte from the anolyte tank to the anolyte baths of the associated electroplating chambers. Ancillary equipment may also be included with electroplating system 200, such as a filter 230, as well as unidentified sensors, valves, and common piping materials and associated components. In some embodiments, bubble separators 235, 237 may be included as will be discussed further below. The piping configuration is exemplary only, and is included to show potential lines including returns to the catholyte tank 220 including from filter 230, bubble separators 235, 237, and electroplating chambers 205, 210. Other fluid configurations are similarly encompassed by the present technology.

Electroplating system 200 may also include an oxygen-delivery apparatus 240. Oxygen-delivery apparatus 240 may be configured to provide an oxygen-containing fluid within the electroplating system. Oxygen-delivery apparatus 240 may be configured to provide the oxygen-containing fluid to one or more positions within the system as will be explained with reference to the figures. For example, as illustrated in electroplating system 200, oxygen-delivery apparatus 240 may be fluidly coupled with the catholyte tank 220 as illustrated. The oxygen-delivery apparatus may be fluidly coupled to provide the oxygen-containing fluid directly into the catholyte tank 220 at one or more positions.

Oxygen-delivery apparatus 220 may be any number of devices that may provide oxygen or an oxygen-containing material within the electroplating system 200. The oxygen-containing material may be any fluid, including gases and liquids, that may be capable of providing oxygen within the electroplating system. For example, in one form, oxygen-delivery apparatus 240 may be a tank of compressed oxygen. Oxygen may be released from the tank and delivered through the catholyte to increase a dissolved-oxygen concentration. Oxygen-delivery apparatus 240 may also be an ozone generator that may deliver ozone into the catholyte. Additionally, oxygen-delivery apparatus 240 may be an oxygen concentrator or generator. An oxygen concentrator may be a beneficial apparatus as it may provide a more controlled and longer term delivery of oxygen compared to a tank of compressed oxygen, for example. An oxygen concentrator may include a compressor that draws ambient air into the concentrator. Nitrogen, as well as other constituents, may be removed from the air stream with a filter or sieve, which may increase the oxygen concentration within the gas.

For example, ambient air typically has an oxygen concentration of roughly 21% by volume. However, air that has been processed by a concentrator may provide an oxygen concentration above 40%, or above or about 50%, above or about 60%, above or about 70%, above or about 80%, above or about 90%, above or about 95%, above or about 99%, or higher. The airflow exiting the oxygen concentrator may then be delivered to the catholyte tank 220 as illustrated. In any of these embodiments, the oxygen-delivery apparatus 240 may be a local device incorporated within the electroplating system 200. A benefit of any of these devices is that the oxygen-delivery apparatus can be retrofitted onto virtually any electroplating system to reduce hillock formation discussed above. During operation, the oxygen-delivery apparatus may provide at least about 200 mL/minute of oxygen, and may provide greater than or about 500 mL/minute, greater than or about 1 liter/minute, greater than or about 3 liter/minute, greater than or about 5 liter/minute, greater than or about 10 liter/minute, greater than or about 15 liter/minute, greater than or about 20 liter/minute, or between or within any of these rates.

Oxygen gas delivered from the oxygen-delivery apparatus 240, such as from an oxygen concentrator, for example, may be bubbled into the catholyte within the catholyte tank 220. This may allow a dissolved-oxygen concentration to be increased within the catholyte. By providing the oxygen directly to the catholyte, bubble formation may also be limited to the ancillary equipment away from the electroplating chamber. Otherwise, if bubbles form in or are delivered to the chamber, and specifically to the cathode bath, they may reside in substrate features affecting wetting and producing defects in metal deposition. Accordingly, when oxygen gas is delivered to the catholyte tank, the bubbles may flow to the surface and escape to the atmosphere, while still providing an amount of dissolved oxygen to the electroplating system.

However, this delivery may be less efficient due to the characteristics of the catholyte tank. For example, the catholyte tank may be limited to a fluid height of centimeters up to about half a meter. This may limit the amount of time for oxygen to be entrained within the catholyte before escaping the fluid. Accordingly, in some embodiments, the oxygen-delivery apparatus 240 may be fluidly coupled with the catholyte tank proximate an intake to pump 225, as illustrated by dashed line 245 in FIG. 2. The oxygen-delivery apparatus outlet pipe or nozzle may be directly coupled with an intake of the pump, or the outlet of the oxygen-delivery apparatus may be extended towards the pump to increase the amount of flow of oxygen-containing fluid, such as high-oxygen content air as described previously, that is directly drawn into the pump 225 inlet. By providing the oxygen towards the inlet of the pump, the oxygen may flow with the catholyte for one meter up to several meters prior to entering the catholyte bath of the electroplating chamber. Accordingly, a higher concentration of dissolved oxygen may be entrained within the catholyte, and a more efficient delivery may be afforded.

As explained previously bubbles within the catholyte may be detrimental to plating operations. Accordingly, electroplating system 200 may include bubble separators 235, 237 to remove remaining bubbles of oxygen prior to fluid delivery into the first bath 206 and third bath 212 of the electroplating chambers. Bubble separators 235, 237 may be fluidly coupled between the pump 225 and the baths of the electroplating chambers in a parallel loop with a return to the catholyte tank to draw bubbles from the fluid prior to delivery during processing. As illustrated, delivery from the bubble separators may include a flow of catholyte having increased dissolved-oxygen content delivered into the electroplating chambers, and may include a return path for oxygen bubbles and catholyte fluid back to catholyte tank 220.

The amount of oxygen incorporated within the catholyte may be greater than or about 5 ppm in some embodiments, and may be greater than or about 10 ppm, greater than or about 15 ppm, greater than or about 20 ppm, greater than or about 30 ppm, greater than or about 40 ppm, greater than or about 50 ppm, or more. Testing utilizing systems according to the present technology has shown that by increasing the dissolved-oxygen content within the electroplating system, the production of copper (I) may be reduced, which may reduce the amount of hillock formation across a substrate. For example, exemplary testing determined that when dissolved-oxygen concentration within electrolytes, either single electrolytes or one or both of anolytes or catholytes, was above 20 ppm, hillock formation was reduced by at least an order of magnitude. A standard semiconductor wafer under standard operation resulted in several hundred hillocks formed across the surface, while a standard semiconductor wafer processed in a system according to the present technology resulted in less than ten hillocks across the wafer. Consequently, the present technology provides an economical and effective solution to copper (I) formation in electroplating environments.

The incorporation of oxygen within the electroplating system may be monitored by incorporating a dissolved-oxygen sensor within the electroplating system, such as dissolved-oxygen sensor 250 of electroplating system 200. One or more dissolved-oxygen sensors may be positioned in any number of locations within exemplary electroplating systems including within the catholyte tank 220, within the anolyte tank, or within one or both baths of the two-bath electroplating chambers 205, 210. Because the flow rate of electrolyte may be up to or greater than about 3 liters/minute, the dissolved-oxygen concentration may be substantially or essentially equivalent throughout the electroplating system. The dissolved-oxygen sensor or sensors may provide feedback within the electroplating system including a dissolved-oxygen concentration. The dissolved-oxygen sensor may be in communication with the oxygen-delivery apparatus either directly or indirectly, such as through a controller. The feedback from the dissolved-oxygen sensor may be used to modulate the oxygen-delivery apparatus to increase, decrease, or maintain the oxygen delivery into the electroplating system to maintain a dissolved-oxygen concentration. For example, feedback from the dissolved-oxygen sensor may be used to maintain an oxygen concentration above about 10 ppm, above about 15 ppm, above about 20 ppm or greater within the electroplating system.

Figure 3:
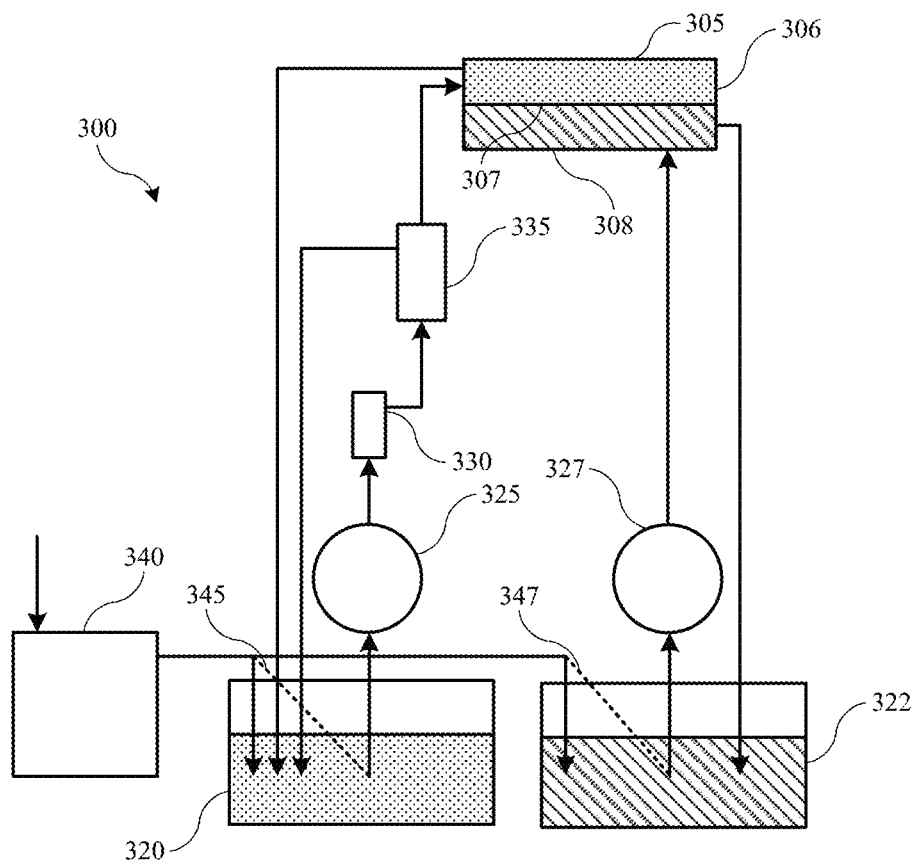
FIG. 3 shows a schematic view of an electroplating system according to some embodiments of the present technology.

Turning to FIG. 3 is shown a schematic view of an electroplating system 300 according to some embodiments of the present technology. Electroplating system 300 may include any of the components or configurations of electroplating system 200 described previously, and may illustrate an additional distribution of oxygen-containing fluid within the electroplating system. Similarly to electroplating system 200, electroplating system 300 may include a two-bath electroplating chamber 305 including a first bath 306 configured to maintain a catholyte and a second bath 308 configured to maintain an anolyte as previously described. Electroplating system 300 may include a separator 307 configured to fluidly separate the catholyte bath from the anolyte bath, while allowing selective ionic transmission across the separator. Although illustrated with only a single electroplating chamber 305, it is to be understood that electroplating system 300 may include any number of chambers and associated components as previously described.

Electroplating system 300 may include a catholyte bath 320 as well as an anolyte bath 322. The two baths may contain different concentrations of electrolyte as well as different chemistries. For example, additives may be present in catholyte bath 320 but not in anolyte bath 322 in some embodiments. One or more pumps may be incorporated within electroplating system 300, such as first pump 325, which may be fluidly coupled between catholyte tank 320 and first bath 306, and may be configured to provide catholyte from the catholyte tank to the first bath. Additionally, electroplating system 300 may include a second pump 327 fluidly coupled between anolyte tank 322 and the second bath 308. The second pump 327 may be configured to provide anolyte from the anolyte tank to the second bath. Additionally, electroplating system 300 may include oxygen-delivery apparatus 340, which may be configured to provide an oxygen-containing fluid within the electroplating system.

Oxygen-delivery apparatus 340 may be coupled with catholyte tank 320 as previously described with relation to electroplating system 200, and in some embodiments may be coupled proximate an intake to the first pump 325 via coupling 345 as discussed above. Oxygen-delivery apparatus 340 may additionally be fluidly coupled with anolyte tank 322 as illustrated, and in some embodiments may be fluidly coupled proximate an intake to the second pump 327, as illustrated via coupling 347, which may provide greater entrainment of oxygen as discussed above. Electroplating system 300 may include a filter 330, bubble separator 335, and other ancillary equipment coupled within the catholyte lines as discussed previously with electroplating system 200, and may include similar equipment with the anolyte piping as well. In some embodiments a bubble separator may not be incorporated with the anolyte system. In a two-bath electroplating chamber, the separator 307 or membrane between the anolyte and catholyte may additionally operate to ensure bubbles within the anolyte are not distributed into the catholyte, where they may cause deposition issues as noted previously. Accordingly, because bubbles that may be resident or not fully dissolved within the anolyte may be maintained separate from the catholyte, additional bubble separation may not be required.

Figure 4:
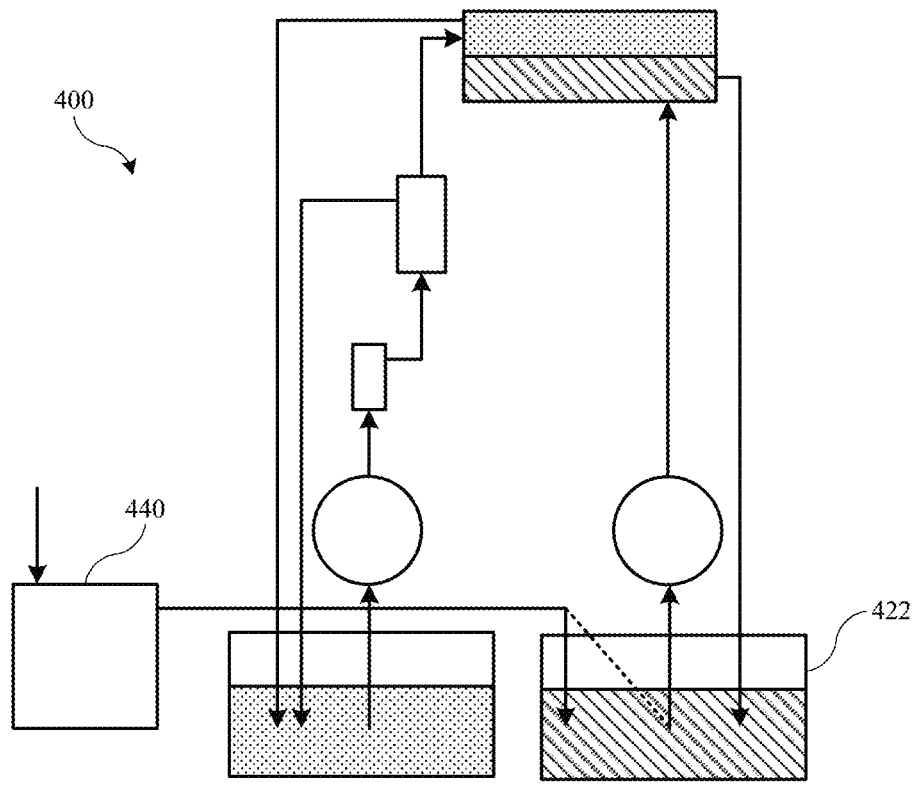
FIG. 4 shows a schematic view of an electroplating system according to some embodiments of the present technology.

FIG. 4 shows a schematic view of an electroplating system 400 according to some embodiments of the present technology. Electroplating system 400 may be similar to electroplating system 300, although electroplating system 400 may include some or all of the components or configurations of electroplating system 200 in some embodiments. Electroplating system 400 illustrates an additional configuration where the oxygen-delivery apparatus 440 is fluidly coupled with the anolyte tank 422 alone, and may not include coupling with the catholyte tank. However, a similar configuration may be realized in the electroplating system 300 with the use of valves and piping, which may selectively distribute oxygenated fluid between the two electrolyte tanks.

Figure 5:
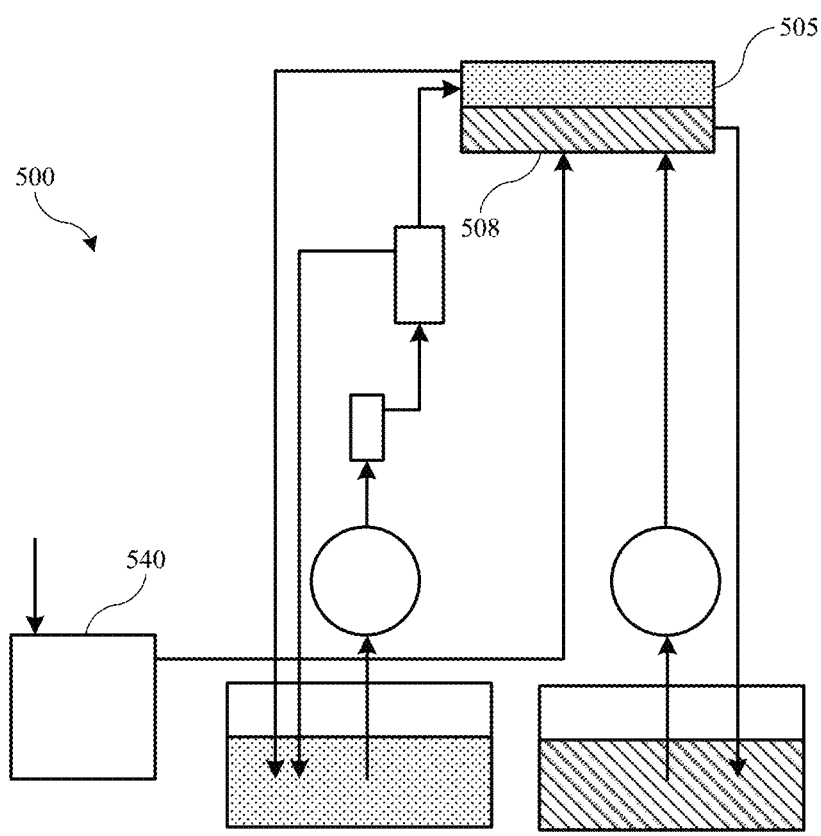
FIG. 5 shows a schematic view of an electroplating system according to some embodiments of the present technology.

FIG. 5 shows a schematic view of an electroplating system 500 according to some embodiments of the present technology. Electroplating system 500 may be similar to electroplating system 400 or electroplating system 300, although electroplating system 500 may include some or all of the components or configurations of electroplating system 200 in some embodiments. Electroplating system 500 illustrates an additional configuration where the oxygen-delivery apparatus 540 is fluidly coupled with the second bath 508 of the two-bath electroplating chamber 505. As previously noted, when bubbles of oxygen are delivered into the anolyte in a two-bath system, the separator may operate to ensure bubbles are maintained separately from the catholyte bath, where deposition may occur. Accordingly, in some embodiments the oxygen-containing fluid, such as oxygen for example, may be delivered directly to the anolyte bath of the electroplating chamber, obviating or altering the ancillary equipment that may be used to provide oxygen within the system.

As illustrated with each of the previous figures, oxygen-containing fluids may be incorporated with either or both of the catholyte or anolyte in two-bath systems. Additionally, although illustrated as separate figures, it is to be understood that any of the configurations may be provided or realized in a single system with piping and controllable valves providing each of the delivery streams discussed. Accordingly, any of the configurations may be combined with any of the other configurations discussed, and any described component, configuration, or characteristic may be present within any encompassed design. By providing oxygen within the catholyte, oxidation of produced copper (I) species may be controlled where the clusters may be formed. Additionally, or alternatively, by providing oxygen within the anolyte, copper (I), which is substantially produced at the anode, may be oxidized prior to entering the catholyte and interacting with the additives that may facilitate clustering of copper (I) ions. In any configuration, the technology may reduce clustering or formation of copper (I), and may reduce or limit the production of hillocks on substrate surfaces.

Figure 6:
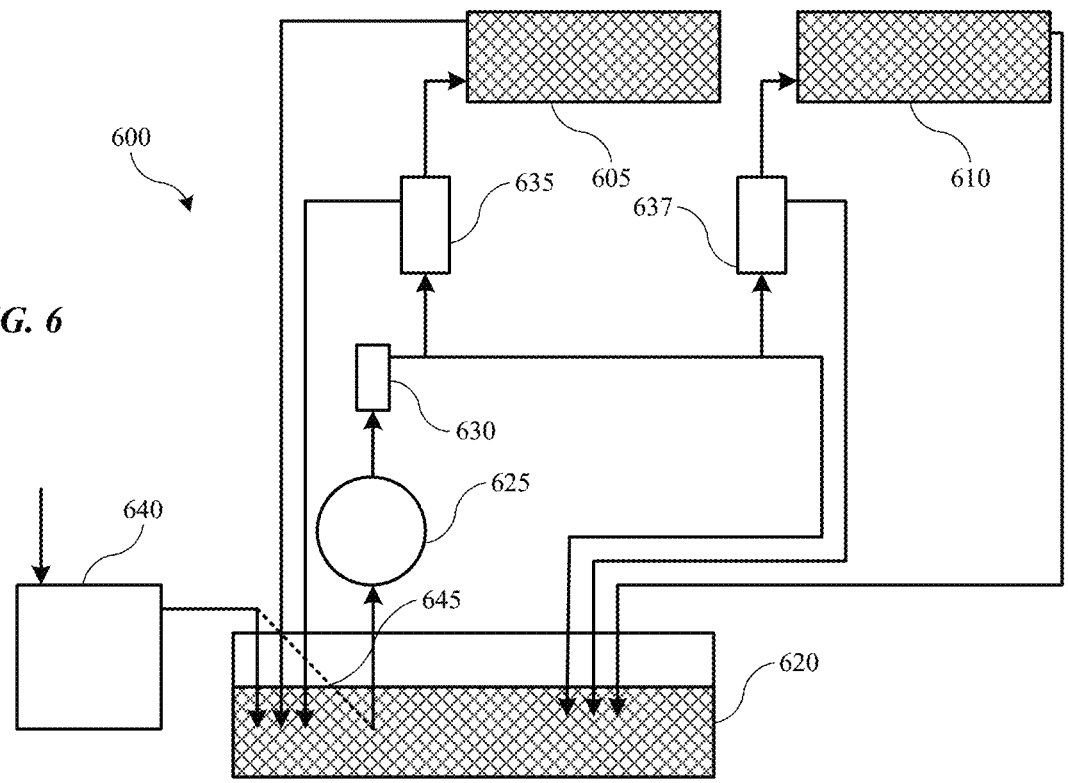
FIG. 6 shows a schematic view of an electroplating system according to some embodiments of the present technology.

The present technology may similarly be utilized in single-bath systems in some embodiments. FIG. 6 shows a schematic view of an electroplating system 600 according to some embodiments of the present technology. Electroplating system 600 may include some or all of the components discussed previously, although a single electrolyte may be used within the systems alternatively to a separate catholyte and anolyte. The components of electroplating system 600 may operate similarly to the components described above. As illustrated, electroplating system 600 may include an electroplating chamber 605, as well as an additional electroplating chamber 610. Similar to previous systems, electroplating system 600 may include any number of electroplating chambers within the system. The electroplating chambers 605, 610 may be configured to house an electrolyte that is distributed through the system. Electroplating system 600 may include an electrolyte tank 620 fluidly coupled with the electroplating chambers 605, 610, and configured to maintain the electrolyte that is distributed.

Electroplating system 600 may include a pump 625 fluidly coupled between the electrolyte tank 620 and the electroplating chamber 620. The pump may be configured to provide electrolyte from the electrolyte tank to the electroplating chamber 605. Electroplating system 600 may also include filter 630, bubble separators 635, 637, and other ancillary equipment in some embodiments. Electroplating system 600 may also include an oxygen-delivery apparatus 640 configured to provide an oxygen-containing fluid within the electroplating system. Oxygen-delivery apparatus 640 may be fluidly coupled with the electrolyte tank 620, and may also be fluidly coupled proximate an intake to the pump as previously explained, and illustrated by coupling 645. Accordingly, electroplating system 600 may also include bubble separators 635, 637 to limit bubbles within the electroplating chambers 605, 610 as discussed above. Similar to the operation in two-bath systems, the oxygen-containing fluid may be incorporated within the system to maintain a dissolved-oxygen concentration as previously explained, which may be monitored by one or more sensors.

Figure 7:
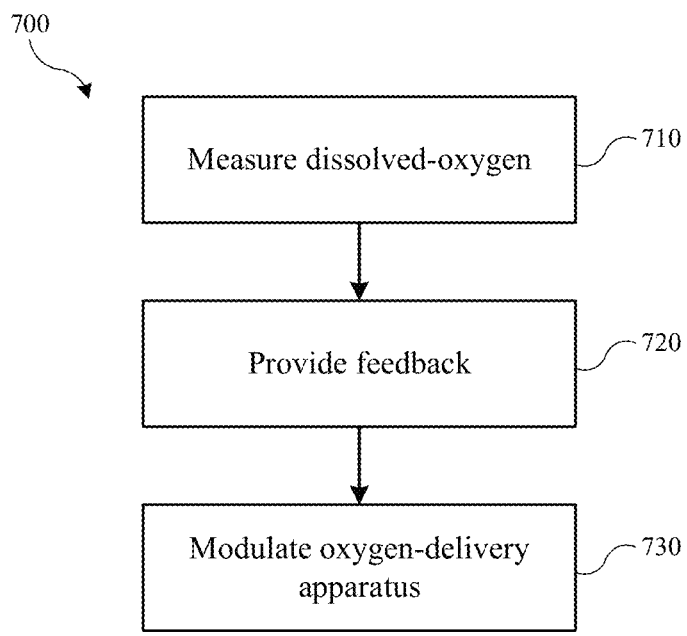
FIG. 7 shows selected operations of a method of maintaining an oxygen concentration in an electroplating system according to some embodiments of the present technology.

The systems described previously may be used to perform one or more methods, such as electroplating operations in which an oxygen-containing fluid is delivered to the system, or in which oxygen concentration is maintained within an electroplating bath. FIG. 7 shows operations of an exemplary method 700 of maintaining an oxygen concentration in an electroplating system according to some embodiments of the present technology. Method 700 may be performed with any of the systems previously described, which may include any of the components or configurations described elsewhere. Method 700 may include measuring a dissolved-oxygen concentration with a sensor within an electroplating system at operation 710. In some embodiments, this measurement may be presumed based on preconditioning or pretesting that may confirm that a particular delivery rate, delivery configuration, and fluid concentration may provide a desired dissolved-oxygen concentration.

Method 700 may also include providing feedback from the sensor regarding the dissolved-oxygen concentration within an electrolyte of the electroplating system at operation 720. The feedback may be provided directly to an oxygen-delivery apparatus as described above, or may be provide to a controller that may operate an oxygen-delivery apparatus, or may provide readouts by which an oxygen-delivery apparatus may be controlled. Method 700 may also include modulating an oxygen-delivery apparatus of an electroplating system to provide an oxygen-containing fluid to maintain a dissolved-oxygen concentration above a threshold at operation 730. The threshold may be at any of the dissolved-oxygen concentrations discussed above, such as above or about 10 ppm or above or about 20 ppm. By incorporating the oxygen-containing fluid within the electroplating system, a concentration of copper (I) ions may be reduced or limited within the electrolyte of the system, and hillock formation along a surface of a substrate being processed may be reduced.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing, encompassed by, or based on any of those values, specifically stated or otherwise included, is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the fluid" includes reference to one or more fluids and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. An electroplating system comprising:
    a two-bath electroplating chamber including a separator configured to provide fluid separation between a first bath configured to maintain a catholyte during operation and a second bath configured to maintain an anolyte during operation;
    a catholyte tank fluidly coupled with the first bath of the two-bath electroplating chamber;
    an anolyte tank fluidly coupled with the second bath of the two-bath electroplating chamber;
    a first pump fluidly coupled between the catholyte tank and the first bath, the first pump configured to provide catholyte from the catholyte tank to the first bath;
    a second pump fluidly coupled between the anolyte tank and the second bath, the second pump configured to provide anolyte from the anolyte tank to the second bath;
    an oxygen-delivery apparatus configured to provide an oxygen-containing fluid within the electroplating system;
    a dissolved-oxygen sensor within the electroplating system configured to provide a concentration of dissolved oxygen; and
    a dissolved-oxygen controller in communication with the oxygen-delivery apparatus and the dissolved-oxygen sensor, the dissolved-oxygen controller programmed to receive feedback from the dissolved-oxygen sensor and operate the oxygen delivery apparatus to maintain the concentration of dissolved oxygen above about 15 ppm.

2. The electroplating system of claim 1, wherein the oxygen-delivery apparatus is fluidly coupled with the anolyte tank.

3. The electroplating system of claim 1, wherein the oxygen-delivery apparatus is fluidly coupled with the second bath of the two-bath electroplating chamber.

4. The electroplating system of claim 1, wherein the oxygen-delivery apparatus is fluidly coupled with the catholyte tank.

5. The electroplating system of claim 4, wherein the oxygen-delivery apparatus is fluidly coupled with the catholyte tank proximate an intake to the first pump, the electroplating system further comprising a bubble separator fluidly coupled between the first pump and the first bath of the two-bath electroplating chamber.

6. The electroplating system of claim 5, wherein the oxygen-delivery apparatus is additionally fluidly coupled with the anolyte tank.

7. The electroplating system of claim 6, wherein the oxygen-delivery apparatus is fluidly coupled with the anolyte tank proximate an intake to the second pump.

8. The electroplating system of claim 1, wherein the electroplating system incorporates the dissolved-oxygen sensor within the catholyte tank, the anolyte tank, or the two-bath electroplating chamber.

9. The electroplating system of claim 1, wherein the oxygen-delivery apparatus comprises a compressor configured to draw ambient air into a filter configured to remove nitrogen from the ambient air.

10. The electroplating system of claim 1, wherein the oxygen-delivery apparatus comprises an ozone generator.

11. The electroplating system of claim 1, further comprising an additional two-bath electroplating chamber including a separator configured to provide fluid separation between a third bath configured to maintain the catholyte during operation and a fourth bath configured to maintain the anolyte during operation.

12. The electroplating system of claim 11, wherein the oxygen-delivery apparatus is fluidly coupled with the catholyte tank proximate an intake to the first pump, wherein the first pump is additionally fluidly coupled between the catholyte tank and the third bath, the electroplating system further comprising a bubble separator fluidly coupled between the first pump and the third bath of the additional two-bath electroplating chamber.

13. An electroplating system comprising:
   an electroplating chamber configured to house an electrolyte;
   an electrolyte tank fluidly coupled with the electroplating chamber;
   a pump fluidly coupled between the electrolyte tank and the electroplating chamber, the pump configured to provide electrolyte from the electrolyte tank to the electroplating chamber;
   an oxygen-delivery apparatus configured to provide an oxygen-containing fluid within the electroplating system;
   a dissolved-oxygen sensor within the electroplating system configured to provide a concentration of dissolved oxygen; and
   a dissolved-oxygen controller in communication with the oxygen-delivery apparatus and the dissolved-oxygen sensor, the dissolved-oxygen controller programmed to receive feedback from the dissolved-oxygen sensor and operate the oxygen delivery apparatus to maintain the concentration of dissolved oxygen above about 15 ppm.

14. The electroplating system of claim 13, further comprising an additional electroplating chamber.

15. The electroplating system of claim 14, wherein the oxygen-delivery apparatus is fluidly coupled with the electrolyte tank proximate an intake to the pump, wherein the pump is additionally fluidly coupled between the electrolyte tank and the additional electroplating chamber, the electroplating system further comprising a bubble separator fluidly coupled between the pump and the additional electroplating chamber.

* * * * *